United States Patent [19]

Okanobu

[11] Patent Number: 4,567,444
[45] Date of Patent: Jan. 28, 1986

[54] CURRENT MIRROR CIRCUIT WITH CONTROL MEANS FOR ESTABLISHING AN INPUT-OUTPUT CURRENT RATIO

[75] Inventor: Taiwa Okanobu, Tokyo, Japan

[73] Assignee: Sony Corporation, Tokyo, Japan

[21] Appl. No.: 612,893

[22] Filed: May 22, 1984

[30] Foreign Application Priority Data

May 26, 1983 [JP] Japan ................................ 58-92698

[51] Int. Cl.[4] ............................................. H03F 3/45
[52] U.S. Cl. .................................... 330/257; 330/288
[58] Field of Search ............... 330/257, 288, 293, 260; 323/315, 316

[56] References Cited

FOREIGN PATENT DOCUMENTS 0000611 1/1980 Japan .................................. 330/257

Primary Examiner—Eugene R. LaRoche
Assistant Examiner—Steven J. Mottola
Attorney, Agent, or Firm—Lewis H. Eslinger; Alvin Sinderbrand

[57] ABSTRACT

A current mirror circuit is formed of input and output transistors of the same polarity having emitters commonly connected to a reference potential and bases connected in common, the collector of the input transistor is connected to ground through a constant current source which initially establishes the input current, a differential amplifier compares the collector current of the input transistor to a desired input current as determined by a bias voltage applied to one input of the differential amplifier and provides negative feedback to maintain the desired input current, thereby to maintain a desired output-to-input current ratio.

3 Claims, 6 Drawing Figures

CURRENT MIRROR CIRCUIT WITH CONTROL MEANS FOR ESTABLISHING AN INPUT-OUTPUT CURRENT RATIO

BACKGROUND OF THE INVENTION

1. Field of the Invention

The present invention relates generally to current mirror circuits and, more particularly, to current mirror circuit which can operate at a low voltage and have high precision.

2. Description of the Prior Art

Generally current mirror circuits are used as part of a current control circuit, usually in conjunction with a constant current source or constant current stage for biasing purposes and as active loads to simulate large-value resistors in high-gain amplifier stages in integrated circuits. A typical pnp semiconductor current mirror circuit is formed of a pair of transistors connected base-to-base, with one of the transistors having its base and collector junctions connected together to form a diode. The collector-emitter path of the diode-connected transistor is connected to ground through a constant current source, which causes a fixed current to flow therethrough. This is the so-called input current. The emitters of the pnp transistors are connected in common to a source of bias voltage, and the output current is taken off through the collector circuit of the transistor not connected as a diode. This kind of constant current source then operates so that the input current generates an equal output current that is stable over a wide range of temperature and bias conditions.

In a current mirror circuit according to one known configuration, even though the base current flowing between the two transistors is substantially less than either of the principal currents, that is, the input or output currents flowing in the circuit, it cannot nevertheless be ignored and, thus, each of the transistors forming the current mirror circuit has a finite gain or current amplification factor. This current amplification in the transistors forming the current mirror circuit then provides a real influence on the output-to-input current ratio that cannot be ignored. Specifically, this current amplification becomes problematic when it is desired to obtain a large output-to-input current ration. Also, even though the current amplification factor is small, the precision is degraded, that is, the degree to which the desired output-to-input current ratio can be precisely obtained is diminished.

One prior approach to overcoming this lack of precision in the current mirror circuit is to connect another transistor in the common base circuit to provide internal feedback. In one such known approach the common base circuit is connected to relative ground potential through the collector-emitter circuit of a third transistor, and the base-collector circuit of the transistor that is normally diode connected is connected between the base and emitter circuit of this third transistor. Nevertheless, a principal drawback in this improved current mirror circuit is that the operating voltage is set as two times the base-emitter voltage of the transistors forming the circuit, so that this current mirror circuit cannot operate at the low voltages advantageously used in modern semiconductor integrated circuits.

OBJECTS AND SUMMARY OF THE INVENTION

Accordingly, it is an object of the present invention to provide a current mirror circuit that can eliminate the above-noted defects inherent in the prior art.

It is another object of the present invention to provide a current mirror circuit that can precisely provide any selected output-to-input current ratio.

It is a further object of the present invention to provide a current mirror circuit that can operate over a wide range of voltages.

It is still another object of the present invention to provide a current mirror circuit that can function at a low operation voltage relative to known current mirror circuits.

In accordance with an aspect of the present invention, a current mirror circuit is provided having the generally known configuration of two transistors with their base circuits mutually connected and their respective emitter circuits connected to a source of bias voltage. The collector circuit of a first transistor is connected to relative ground potential through a constant current source with the collector circuit of a second transistor being connected to the load or current-use device, and a differential amplifier is connected to the two transistors forming the current mirror circuit. The differential amplifier is connected at one input to the collector lead of the transistor to which is connected the current source and at the other input to a second bias voltage source, which is in addition to a bias source connected to the common emitter connection of the differential amplifier. This provides a non-inverting current amplifier, which permits the output-to-input current ratio to be controlled with precision.

In accordance with another aspect of the present invention, a current mirror circuit is provided in which the differential amplifier connected in the collector and base circuits of the pair of transistors forming the principal current mirror circuit is connected to the first source of bias voltage through a resistive element, thereby permitting the current mirror circuit to operate at a substantially lower voltage relative to conventional current mirror circuits.

The above, and other objects, features, and advantages of the present invention will become apparent from the following detailed description of illustrated embodiments thereof to be read in conjunction with the accompanying drawings, in which like reference numerals represent the same or similar parts.

DETAILED DESCRIPTION OF PREFERRED EMBODIMENTS

Figure 1:
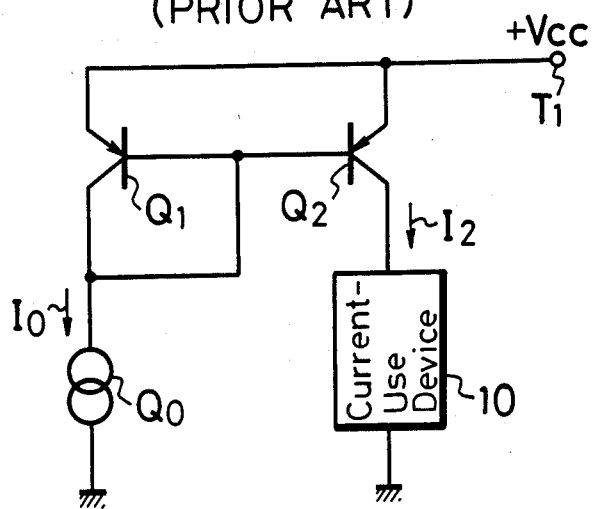
FIG. 1 is a schematic diagram of a current mirror circuit known in the prior art.

Generally, a so-called current mirror circuit known in the prior art is fundamentally constructed as shown in FIG. 1, that is, two transistors have their base circuits commonly connected and their respective emitter circuits commonly connected to a source of bias voltage. One of the two transistors is connected as a diode by connecting together the base and collector circuits, and the collector circuit of that transistor is also connected to relative ground potential through a constant current source with the load connected in the collector circuit of the other transistor. More specifically, in FIG. 1, input current source $Q_0$ is connected to the collector circuit of transistor $Q_1$ and also to relative ground potential. This input current source is a conventional constant current signal source and establishes the input current $I_0$. The output transistor of the current mirror circuit of FIG. 1 is transistor $Q_2$, and the respective emitter circuits of transistors $Q_1$ and $Q_2$ are connected in common at terminal $T_1$ to which is connected a suitable source of the bias voltage $V_{cc}$. The collector current circuit of transistor $Q_2$ is connected to a current-use device 10 which may be any circuit requiring a known current flow thereinto, such as a portion of a semiconductor integrated circuit that requires a specific bias current. The common base circuit of transistor $Q_1$ and $Q_2$ is connected to the connection point of the collector circuit of transistor $Q_1$ and input current source $Q_0$, in order to cause transistor $Q_1$ to be functionally a diode. This current mirror circuit operates so that when input or reference current $I_0$ flows, as caused by input current source $Q_0$, the output current $I_2$ will flow in the collector circuit of transistor $Q_1$, which is the desired current flowing into current-use device 10. That is, the input current $I_0$ is mirrored at the output ($I_2$) and most of the inherent semiconductor temperature instabilies are overcome.

In this known current mirror circuit one way of obtaining the desired output-to-input current ratio is by selecting the ratio of the junction areas at the base-emitter paths of the respective transistors $Q_1$ and $Q_2$. For example, the ratio between the semiconductor junction areas in the base-emitter paths of the transistor $Q_1$ and $Q_2$ may be chosen as 1:n to satisfy:

$$\frac{I_2}{I_0} = \frac{n}{1} \quad (1)$$

Nevertheless, even if such base-emitter junction areas are chosen appropriately, there are finite amounts of base current flowing in transistors $Q_1$ and $Q_2$ that cannot be neglected. This base current then results in the following:

$$\frac{I_2}{I_0} = \frac{1}{1 + \frac{1+n}{h_{FE}}} \cdot n \quad (2)$$

Note that $h_{FE}$ is the forward current transfer ratio in the common emitter configuration, that is, the forward current amplification factor of transistors $Q_1$ and $Q_2$ and, therefore, the simplification of equation (1) above to obtain the desired current ratio $I_2/I_0$ cannot be employed in the design of such current mirror circuits. Moreover, upon reviewing equation (2) above, it may be seen that this problem is exacerbated when the value of small n becomes larger or when the current amplification factor $h_{FE}$ becomes smaller, thereby decreasing the precision with which the desired current ratio can be obtained.

Figure 2:
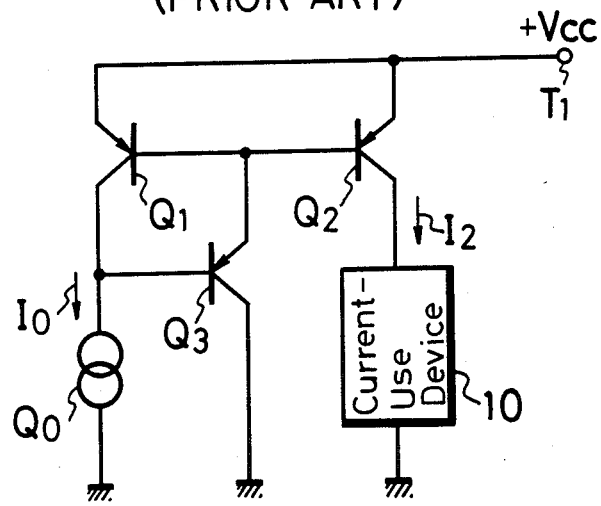
FIG. 2 is a schematic diagram of another embodiment of a current mirror circuit known in the prior art, in which the operation voltage is at least twice the base-emitter voltage of the transistors.

To overcome this drawback in the known current mirror circuit of FIG. 1, an improved current mirror circuit, shown in FIG. 2 was proposed for use. In this current mirror circuit in place of tying the common base circuit to the collector circuit containing input current source, the base current of transistors $Q_1$ and $Q_2$ is amplified by an additional transistor $Q_3$ having its emitter connected to the base circuit, its collector circuit connected to relative ground potential, and its base circuit connected to the connection point between the collector circuit of transistor $Q_1$ and the input current source $Q_0$. Because the base current of transistors $Q_1$ and $Q_2$ is obtained after it has been current amplified by action of transistor $Q_3$ the output/input current ratio may be given as follows:

$$\frac{I_2}{I_0} = \frac{1}{1 + \frac{1+n}{h_{FE2}}} \cdot n \quad (3)$$

Thus, it may be seen that error or imprecision in obtaining the current ratio $I_2/I_0$ becomes based on $1/h_{FE}$ in the circuit of FIG. 2, as compared with the current mirror circuit shown in FIG. 1 and, thus, the output-to-input current ratio precision is improved.

Nevertheless, the current mirror circuit of FIG. 2 also has drawbacks because it requires an operation voltage higher than that of the circuit of FIG. 1, more specifically, the operation voltage must be $2V_{BE}$, where $V_{BE}$ is the base-emitter voltage of transistors $Q_1$ or $Q_2$, and $Q_3$ This may be seen because the current path between $V_{cc}$ and ground potential must pass through two transistors forming the current mirror circuit of FIG. 2. One way to improve the output-to-input current ratio precision of the known current mirror circuit of FIG. 2 would be to include emitter resistors in transistors $Q_1$ and $Q_2$ however, this would then raise even further the operating voltage of the circuit. Note that the current mirror circuit of FIG. 1 has $V_{BE}$ as its lowest possible operation voltage, where $V_{BE}$ is the base-emitter junction voltage drop either across transistor $Q_1$ or $Q_2$. Note further that in the current mirror circuit of FIG. 2, the collector potential of transistor $Q_1$ relative to the bias voltage $V_{cc}$ is fixed as $V_{cc} - 2V_{BE}$, whereas in the current mirror circuit of FIG. 1, the collector potential of transistor $Q_1$ relative to the bias voltage source $V_{cc}$ is fixed at $V_{cc} - V_{BE}$. Thus, it is seen that the collector potential relative to the bias voltage cannot be arbitrarily selected but is a function of the parameters of the specific transistors chosen for these current mirror circuits, transistors being used herein the generic sense and can be formed in an integrated circuit or as discrete devices.

Figure 3:
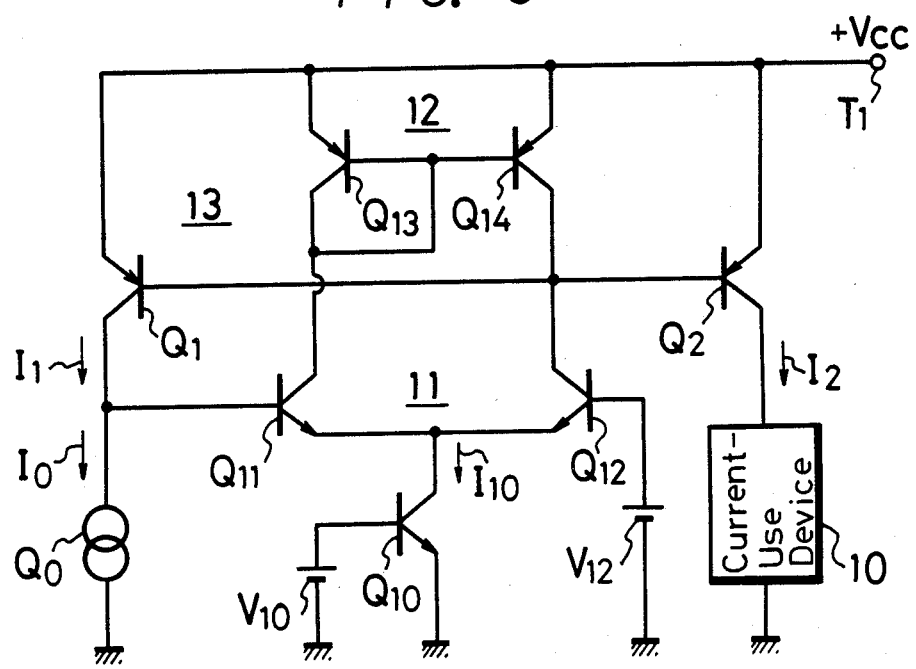
FIG. 3 is a schematic diagram of a current mirror circuit according to an embodiment of the present invention, in which the output-to-input current ratio can be selected with precision.

The present invention overcomes the above-noted defects in the art described relative to FIGS. 1 and 2, and FIG. 3 shows an embodiment of the present invention, wherein the elements typically forming a current mirror source are present. More specifically, transistors $Q_1$ and $Q_2$ have their base circuits connected together and their respective emitter circuits commonly connected to a source of bias voltage $V_{cc}$ at terminal $T_1$. The input current $I_0$ is caused to flow through action of the constant current source $Q_0$ connected in the collector circuit of the first transistor $Q_1$, and the output current $I_2$ flows into the current-use device 10 connected in the collector circuit of the second transistor $Q_2$. At that point the similarities with known circuits end, and a differential amplifier 11 is used to control the base currents of transistors $Q_1$ and $Q_2$. This differential amplifier 11 is formed of a pair of differentially connected transistors $Q_{11}$ and $Q_{12}$, which have semiconductor polarities opposite to the semiconductor polarities of the transistors $Q_1$ and $Q_2$. Specifically, in this embodiment transistors $Q_1$ and $Q_2$ are PNP transistors and transistors $Q_{11}$ and $Q_{12}$ are NPN transistors. Differential amplifier transistors $Q_{11}$ and $Q_{12}$ have their respective emitter circuits commonly connected to a second constant current source formed of transistor $Q_{10}$ and voltage source $V_{10}$. Specifically, transistor $Q_{10}$ has its collector circuit connected to the common emitters of transistors $Q_{11}$ and $Q_{12}$, its emitter circuit connected to a relative ground potential, and is connected to be driven in its base circuit by bias voltage source $V_{10}$, thereby causing a constant current $I_{10}$ to flow through the collector emitter circuit of transistor $Q_{10}$ and setting the reference current of the differential amplifier 11.

One input of the differential amplifier 11 being formed of transistors $Q_{11}$ and $Q_{12}$ is the base circuit of transistor $Q_{11}$ that is connected to the collector circuit of transistor $Q_1$ of the current mirror circuit, and the other input of the differential amplifier 11 is the base circuit of transistor $Q_{12}$ that is connected to the positive voltage of bias voltage source $V_{12}$. The differential amplifier 11 is connected to an auxiliary current mirror circuit 12 comprised of transistors $Q_{13}$ and $Q_{14}$. Auxiliary current mirror circuit 12 is the same as the known current mirror circuit of FIG. 1, in which two transistors $Q_{13}$ and $Q_{14}$ are connected in a common emitter configuration to a source of bias voltage $V_{cc}$ and the common base circuits being clamped to the collector circuit of one of the transistors. Thus, transistors $Q_{13}$ and $Q_{14}$ comprise a conventional current mirror circuit with the input current being derived through the collector circuit of transistor $Q_{11}$ and the output current being connected to drive the common base circuit of the basic current mirror circuit $Q_1$ and $Q_2$. The input current of current mirror circuit 12 is determined by the differential amplifier and is $I_{10}$. In this auxiliary current mirror circuit 12 employed in this embodiment of the present invention, the output-to-input current ratio is chosen to be 1, that is, n=1.

In the circuit of FIG. 3, the combination of the differential amplifier 11 and the current mirror circuit 12 form a non-inverting current amplifier 13 and by connecting the non-inverting amplifier to transistors $Q_1$ and $Q_2$, as shown in FIG. 3, so that the current that results from dividing the base current of transistors $Q_1$ and $Q_2$ by the current gain of non-inverting current amplifier 13 is the base current of transistor $Q_{11}$. Thus, the differential amplifier circuit 11 compares the collector current $I_1$ of transistor $Q_1$ and the fixed input current $I_0$ as determined by constant current source $Q_0$ and the difference therebetween is negatively fed back to transistor $Q_1$ by non-inverting amplifier 13. Therefore, the equation for the output/input current ratio of the current mirror circuit of FIG. 3 is derived as follows:

$$\frac{I_2}{I_0} = n\left(1 + \frac{I_{10}}{I_0}\right) \cdot \frac{1}{2h_{FE}}$$

Note that $I_{10}$ is the collector-emitter current flowing in transistor $Q_{10}$ and if $I_{10}/I_0$ can be selected to be small enough, that is, selected to be close enough to zero, then equation (4) above is approximately the same as equation (1) above, which is the output-to-input current ratio for the known current mirror circuit of FIG. 1.

The above analysis relative to the transistors forming the subject circuits has been performed using the small signal or direct current analysis method, however, in the situation where the input current $I_0$ has an alternating current component, then the output/input current ratio would be given by the following equation:

$$\frac{i_2}{i_0} \approx n\frac{\left(\frac{n}{1+n+1}\right)}{h_{FE1} \cdot h_{FE11}} \tag{5}$$

Where $i_0$ is the input current having an alternating current component; $i_2$ is the output current having a corresponding alternating current signal component; $h_{FE1}$ is the forward current transfer ratio or gain of transistors $Q_1$, $Q_2$, $Q_{13}$, and $Q_{14}$; and $h_{FE11}$ is the forward current transfer ratio of transistors $Q_{11}$ and $Q_{12}$.

The current mirror circuit shown in FIG. 3 provides excellent output-to-input current ratio precision and its operation voltage is determined principally by bias voltage $V_{12}$ and, therefore, can be arbitrarily controlled over a relatively wide range from approximately $(V_{cc}-V_{BE})$ to around $V_{BE}$. Also, because the voltage $V_{cc}$ at terminal $T_1$ can be selected to be at or above $(V_{BE}+V_{CE})$, the current mirror circuit of FIG. 3 can operate at a low voltage level relative to the known current mirror circuits.

Figure 4:
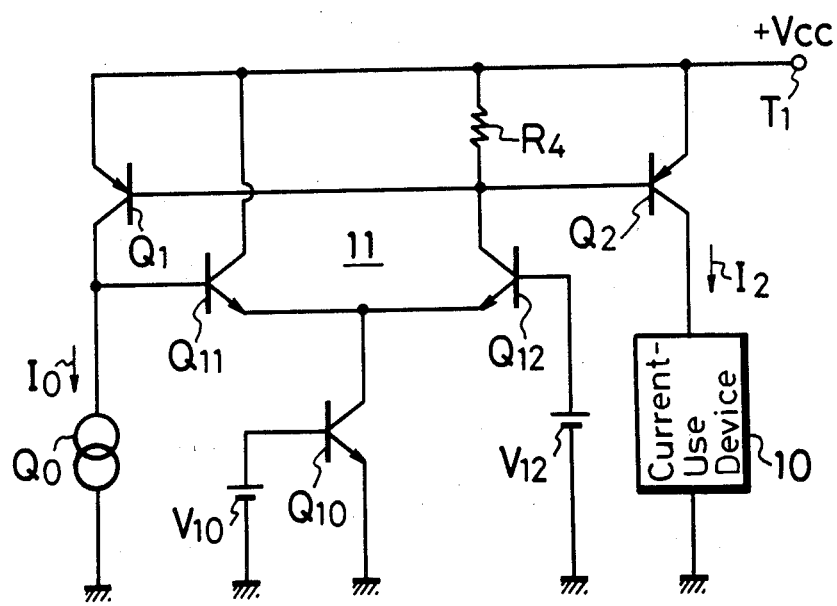
FIG. 4 is a schematic diagram of a current mirror circuit according to a second embodiment of the present invention, in which the operating voltage is low relative to known current mirror circuits.

While the current mirror provided by the present invention embodied in the circuit of FIG. 3 has the advantage that the forward current gain can be selected to be a relatively high level, it has been found to have a disadvantage in that it tends to oscillate relatively easily. This tendency to oscillate has been overcome by modifying the embodiment of FIG. 3 into the embodiment shown in FIG. 4. Comparing the respective circuits of these two figures, it is seen that the auxiliary current mirror circuit 12 of the embodiment of FIG. 3 is replaced by resistor $R_4$ in the embodiment of FIG. 4. Because resistor $R_4$ is a passive component in place of the active-element transistors forming the current mirror circuit 12 in the embodiment of FIG. 3, the tendency to oscillate is eliminated and, thus, the embodiment of FIG. 4 is relatively more stable. As an example of the value of resistor $R_4$, if it is assumed that the output current $I_2$ is to 100 micro-amps flowing into current-use device 10, then the resistance value of resistor $R_4$ can be selected to be approximately 30,000 ohms, which would have a current of 20 micro-amps flowing as the collector current $I_{10}$ through transistor $Q_{10}$ that forms the constant current source for the differential amplifier 11.

Figure 5:
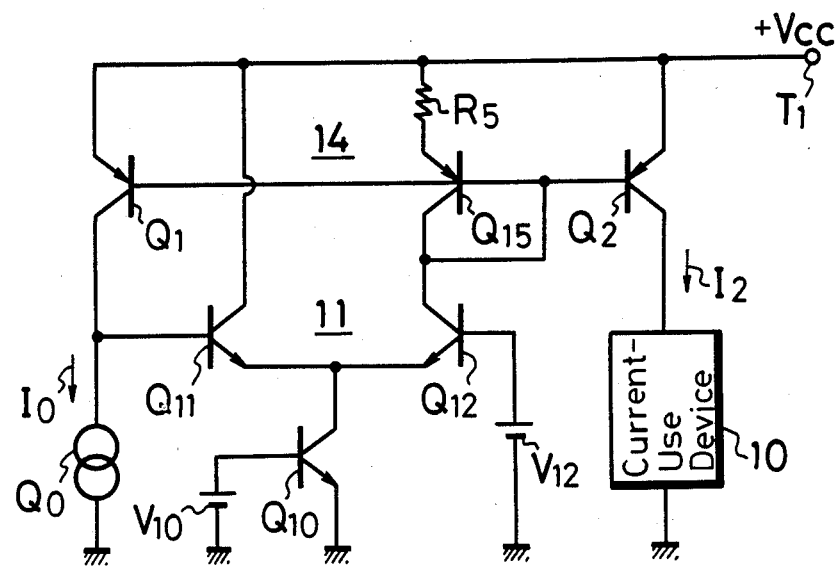
FIG. 5 is a schematic diagram of a current mirror circuit according to a third embodiment of the present invention.

Another embodiment of the present invention shown in FIG. 5 has an additional transistor $Q_{15}$ to connect a resistive element $R_5$ to the common base circuit of transistors $Q_1$ and $Q_2$. Transistors $Q_{15}$ is connected as a diode by tying its base and collector circuits together. In this embodiment a current mirror circuit 14 is formed by the connection as shown of transistors $Q_1$, $Q_{15}$, and $Q_2$. The output current of differential amplifier 11 is fed to the common connection of the base and collector of transistor $Q_{15}$ and the base circuits of transistors $Q_1$ and $Q_2$. This again provides negative feedback to the common base circuit of transistors $Q_1$ and $Q_2$ based upon the detected difference in the collector current of transistor $Q_1$ and the input current $I_0$ by the differential amplifier 11 that has the bias voltage $V_{12}$ as its other input.

Figure 6:
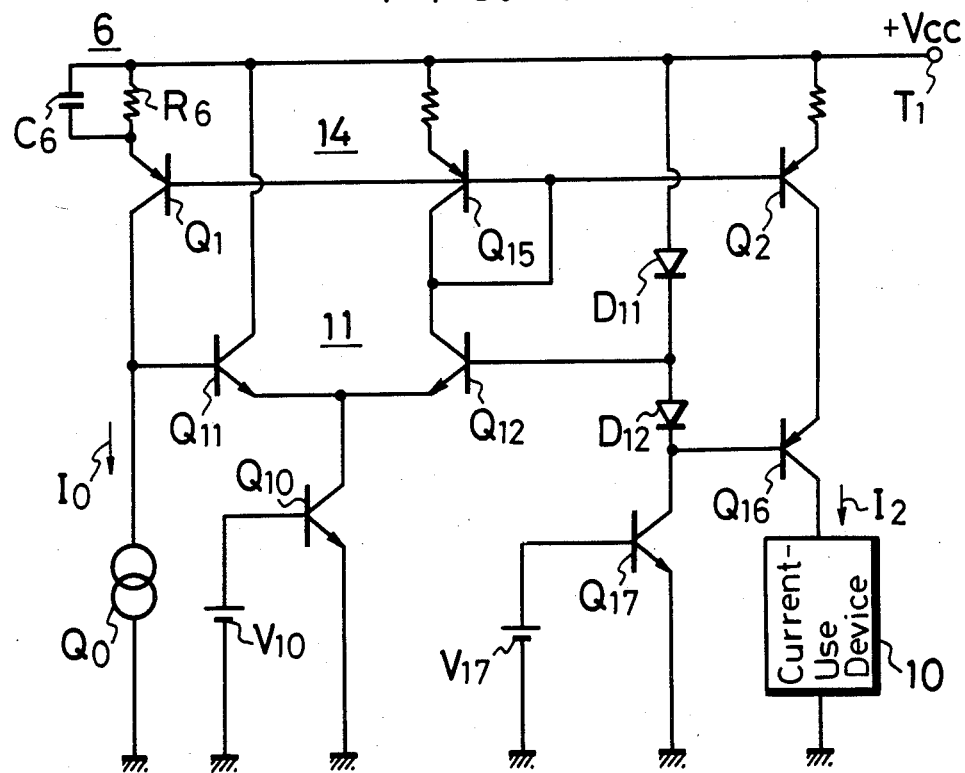
FIG. 6 is a schematic diagram of a current mirror circuit according to a fourth embodiment of the present invention, in which oscillation of the circuit is precluded.

A still further embodiment of the present inventive current mirror circuit is shown in FIG. 6, in which oscillations caused by the use of an auxiliary current mirror circuit are precluded. In the embodiment of FIG. 6, an oscillation-prevention circuit 6 is formed of a parallel-connected capacitor $C_6$ and resistor and $R_6$, which are connected in the emitter circuit of the first or input transistor $Q_1$ between the emitter and terminal $T_1$ to which is connected the source of bias voltage $V_{cc}$. The output current $I_2$ from transistor $Q_2$ is provided to the current-use device 10 through transistor $Q_{16}$. The base lead of transistor $Q_{16}$ is connected to relative ground potential through the collector-emitter path of transistor $Q_{17}$, which is connected as a third constant current source by connecting its base lead to the positive terminal of voltage source $V_{17}$, the other side of voltage $V_{17}$ is connected to ground potential. The base lead of transistor $Q_{12}$, which is connected as in the above-described embodiments as the output side of differential amplifier 11, is connected at a junction between the anode and cathode of diodes $D_{11}$ and $D_{12}$, respectively, these diodes being connected in a series circuit from terminal $T_1$ through the collector-emitter junction of transistor $Q_{17}$, the third constant current source, to relative ground potential. Accordingly, the operating voltage of transistor $Q_{12}$ is fixed or clamped as ($V_{cc}-V_{BE}$). All other elements in the circuit of FIG. 6 are the same as in previous embodiments and this embodiment operates substantially as described hereinabove.

In the embodiment of the present invention shown in FIG. 6, oscillation of the current mirror circuit is precluded and the collector-emitter voltages of transistors $Q_1$ and $Q_2$ can be made equal. Also, because it is possible to increase the voltage level used to achieve the input current $I_0$, designing the circuit for the input current source $Q_0$ becomes easier, and the current mirror circuit can be operated advantageously at a lower operation voltage.

Accordingly, the current mirror circuit of the present invention can accurately and precisely obtain a desired current ratio between the output current and the input current and can operate over a wide range of voltages, and the current mirror circuit of the present invention can also operate at a low operation voltage.

Although illustrative embodiments of the present invention have been described in detail above with reference to the accompanying drawings, it is to be understood that the invention is not limited to those precise embodiments, and that various changes and modifications can be effected therein by one skilled in the art without departing from the scope or spirit of the invention, as defined by the appended claims.

What is claimed is:

1. A current mirror circuit for use with a reference potential and source of constant current, comprising:
    first transistor means having an emitter connected to said reference potential and a collector connected to said source of constant current;
    second transistor means of a polarity the same as said first transistor means and having an emitter connected to said reference potential and a base connected to a base of said first transistor;
    differential amplifier means including third and fourth transistor means of polarity opposite that of said first and second transistor means, a base of said third transistor being connected to the collector of said first transistor;
    bias voltage source means providing a bias voltage to a base of said fourth transistor and a collector of said fourth transistor being connected to the common base connection of said first and second transistors, whereby output current flowing in the collector of said second transistor has a predetermined ratio with the current flowing in said collector of said first transistor to which is connected said constant current source; and
    fifth transistor means, a base of said fifth transistor means being connected to the common base connection of said first and second transistor means and a collector of said fifth transistor means being connected to the collector of said fourth transistor means.

2. A current mirror circuit according to claim 2, further comprising an oscillation preventing circuit comprised of a resistor and capacitor connected in parallel between the emitter of said first transistor means and said reference potential.

3. A current mirror circuit for providing a predetermined ratio between an output current and an input current of the kind for use with a source of reference potential and a source of constant current, comprising:
    an input transistor of a first polarity having its emitter connected to said source of reference potential and its collector connected to said source of constant current;
    an output transistor of the same polarity as said input transistor having its emitter connected to said source of reference potential, its base connected to the base of said input transistor, and its collector connected to have said output current flow therein;
    negative feedback means connected to compare the collector current flowing in said input transistor with a predetermined current value and providing a negative feedback fed to said common base connection for causing said current flowing in said collector of said input transistor to equal said predetermined value of said input current, whereby said output current to input current ratio is said predetermined value;
    said negative feedback means comprising a differential amplifier and a source of bias potential, said differential amplifier having one input connected to said source of bias potential and a second input connected to said collector of said input transistor for producing said negative feedback fed to the common base connection for maintaining said predetermined ratio, said differential amplifier further including third and fourth transistors having a polarity opposite the polarity of said input and output transistors; and
    fifth transistor means having its base connected in common with the bases of said input and output transistors and its collector connected to the collector of said fourth transistor.

* * * * *